(12) United States Patent
Shiba et al.

(10) Patent No.: US 10,640,867 B2
(45) Date of Patent: May 5, 2020

(54) METHOD FOR MANUFACTURING METALLIZED FILM

(71) Applicant: Panasonic Intellectual Property Management Co., Ltd., Osaka (JP)

(72) Inventors: Masaki Shiba, Shimane (JP); Shinsuke Itoi, Shimane (JP); Hiroshi Adachi, Shimane (JP); Yukinori Takamoto, Shimane (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/942,602

(22) Filed: Apr. 2, 2018

(65) Prior Publication Data

US 2018/0223422 A1 Aug. 9, 2018

Related U.S. Application Data

(63) Continuation of application No. PCT/JP2016/004466, filed on Oct. 4, 2016.

(30) Foreign Application Priority Data

Oct. 21, 2015 (JP) .................. 2015-206825

(51) Int. Cl.
*C23C 16/00* (2006.01)
*C23C 16/02* (2006.01)
(Continued)

(52) U.S. Cl.
CPC ............ *C23C 16/02* (2013.01); *C23C 14/042* (2013.01); *C23C 14/20* (2013.01); *C23C 14/24* (2013.01);
(Continued)

(58) Field of Classification Search
CPC .......... C23C 16/00; C23C 14/00; H01G 4/00; Y02T 10/00
See application file for complete search history.

(56) References Cited

U.S. PATENT DOCUMENTS

| 4,832,983 | A | * | 5/1989 | Nagatomi | ............. C23C 14/042 427/177 |
| 5,933,947 | A | * | 8/1999 | Minamizawa | ......... H01G 4/012 29/25.41 |
| 6,018,454 | A | | 1/2000 | Hatada et al. | |

FOREIGN PATENT DOCUMENTS

| AT | 504931 A1 * | 9/2008 |
| CN | 1208940 A | 2/1999 |

(Continued)

OTHER PUBLICATIONS

JP-2011-231389 A, English translated (Year: 2011).*

(Continued)

*Primary Examiner* — David P Turocy
*Assistant Examiner* — Mohammad Mayy
(74) *Attorney, Agent, or Firm* — McDermott Will & Emery LLP

(57) ABSTRACT

The present disclosure provides a method for manufacturing a metallized film, the metallized film including: a dielectric film; a vapor-deposited metal electrode formed on a surface of the dielectric film. The vapor-deposited metal electrode includes a plurality of parts which have mutually different resistance values. The method includes a step of letting oil adhere to a region in the surface of the dielectric film on which the vapor-deposited metal electrode is to be formed and then bringing a vapor of metal into contact with the surface of the dielectric film. A quantity per unit area of the oil adhering to a part of the region on which a part of the vapor-deposited metal electrode having a relatively low resistance value is to be formed is smaller than a quantity per (Continued)

unit area of the oil adhering to another part of the region on which another part of the vapor-deposited metal electrode having a relatively high resistance value is to be formed.

12 Claims, 7 Drawing Sheets

(51) Int. Cl.

| | | |
|---|---|---|
| *H01G 4/18* | (2006.01) | |
| *H01G 4/015* | (2006.01) | |
| *C23C 14/24* | (2006.01) | |
| *C23C 14/20* | (2006.01) | |
| *C23C 14/56* | (2006.01) | |
| *C23C 14/54* | (2006.01) | |
| *C23C 14/04* | (2006.01) | |
| *C23C 16/54* | (2006.01) | |
| *H01G 4/33* | (2006.01) | |
| *C23C 16/06* | (2006.01) | |
| *H01G 4/012* | (2006.01) | |

(52) U.S. Cl.
CPC .......... *C23C 14/541* (2013.01); *C23C 14/562* (2013.01); *C23C 16/545* (2013.01); *H01G 4/015* (2013.01); *H01G 4/18* (2013.01); *H01G 4/33* (2013.01); *C23C 16/06* (2013.01); *H01G 4/012* (2013.01)

(56) References Cited

FOREIGN PATENT DOCUMENTS

| | | |
|---|---|---|
| JP | 10-303056 | 11/1998 |
| JP | 2001-044057 | 2/2001 |
| JP | 2008124245 A * | 5/2008 |
| JP | 2011-231389 | 11/2011 |

OTHER PUBLICATIONS

AT 504931 A1, Google Translate (Year: 2008).*
International Search Report of PCT application No. PCT/JP2016/004466 dated Dec. 20, 2016.
English Translation of Chinese Search Report dated Mar. 27, 2019 for the related Chinese Patent Application No. 201680059785.7.

* cited by examiner

METHOD FOR MANUFACTURING METALLIZED FILM

RELATED APPLICATIONS

This application is a continuation of the PCT International Application No. PCT/JP2016/004466 filed on Oct. 4, 2016, which claims the benefit of foreign priority of Japanese patent application No. 2015-206825 filed on Oct. 21, 2015, the contents all of which are incorporated herein by reference.

BACKGROUND

1. Technical Field

The present disclosure relates to a method for manufacturing a metallized film used in a metallized film capacitor.

2. Description of the Related Art

Metallized film capacitors are broadly categorized into those having electrodes made of metallic foil and those having electrodes made of film shaped or lump shaped metal formed by vapor deposition (hereinafter referred to as vapor-deposited metal) on dielectric films. Metallized film capacitors having electrodes made of vapor-deposited metal (hereinafter referred to as vapor-deposited metal electrodes) have been widely used because of the following reasons. One of the reasons is that the vapor-deposited metal electrode takes up less space in the film capacitor than the metallic foil electrode in the film capacitor and thus film capacitors having the vapor-deposited metal electrodes allow reduction in both size and weight. The other reason is high reliability in resistance to dielectric breakdown owing to the self-healing properties of vapor-deposited metal electrodes (which, in the event of a short circuit at a defective insulation site, allow the vapor-deposited metal electrode around the defective site to evaporate or disperse by short-circuit current energy and get insulated again, and thereby enabling the capacitor to recover functionality).

With reference to FIG. 7, a metallized film used in a metallized film capacitor will be described. FIG. 7 is a cross-sectional view of a metallized film that includes dielectric film 71, i.e. a plastic film made of polyethylene terephthalate, polypropylene, or other materials, and vapor-deposited metal electrode 76 deposited on a surface of dielectric film 71. Vapor-deposited metal electrode 76 is made of aluminum or other vapor-deposited metal.

Vapor-deposited metal electrode 76 is formed on the surface of dielectric film 71 excluding insulation margin 74 that is an area where no vapor-deposited metal exists. Insulation margin 74 is disposed near a first end of dielectric film 71 in a width direction (the lateral direction in FIG. 7). Vapor-deposited metal electrode 76 includes low resistance part 73, connecting part 75, and high resistance part 72. Low resistance part 73 is formed at a second end, which is an opposite side to the first end, of dielectric film 71 in the width direction. Connecting part 75 is formed at the first end. High resistance part 72 is formed on an area other than connecting part 75 and low resistance part 73. A film thickness of the vapor-deposited metal of low resistance part 73 is substantially equal to a film thickness of the vapor-deposited metal of connecting part 75. These film thicknesses are each thicker than a film thickness of the vapor-deposited metal of high resistance part 72. Thus, a resistance value of the vapor-deposited metal of low resistance part 73 and a resistance value of the vapor-deposited metal of connecting part 75 are each lower than a resistance value of the vapor-deposited metal of high resistance part 72.

In a capacitor element formed of such metallized film 70, low resistance part 73 disposed at the second end of dielectric film 71, which is a part of vapor-deposited metal electrode 76 formed on the surface of dielectric film 71, is connected to a metallikon electrode. Since the film thickness of low resistance part 73 is thick, strength in electrical and mechanical connection between vapor-deposited metal electrode 76 and the metallikon electrode can be increased. Meanwhile, since the film thickness of high resistance part 72 is thinner than the film thickness of low resistance part 73, a reduction in withstanding voltage of dielectric film 71 due to the vapor deposition of metal can be suppressed. Further, since the film thickness of connecting part 75 formed at the first end of dielectric film 71 is thicker than the film thickness of high resistance part 72, as the same as in case of low resistance part 73, strength in mechanical connection between the vapor-deposited metal electrode and the metallikon electrode can be increased. These configurations contribute to an improvement in reliability of the metallized film capacitor.

With reference to FIGS. 8 and 9, a conventional method for manufacturing metallized film 70 described above will now be described (as is disclosed in Unexamined Japanese Patent Publication No. 2001-44057).

FIG. 8 is a schematic view illustrating main internal configuration of a conventional vacuum deposition apparatus used to manufacture metallized film 70.

With reference to FIG. 8, the vacuum deposition apparatus includes unwinder 131, cooling roller 132, and evaporation source 135. Unwinder 131 is set with a roll of dielectric film 71 having no vapor-deposited metal electrode formed on a surface. Cooling roller 132 is to cool dielectric film 71. Evaporation source 135 is disposed inside a vacuum chamber near cooling roller 132, the vacuum chamber being maintained in a state of near-vacuum reduced pressure. Evaporation source 135 melts a metal and evaporates the molten metal to form a vapor-deposited metal electrode. The vacuum deposition apparatus further includes mask 134 and winder 133. Mask 134 is disposed inside the vacuum chamber and control a quantity of the vapor-deposited metal formed on dielectric film 71. Winder 133 winds metallized film 70, which has vapor-deposited metal electrode 76 formed on the surface of dielectric film 71, into a roll form.

Dielectric film 71 is unwound from unwinder 131, travels in a direction shown by an arrow, and is supported and cooled by cooling roller 132 turning in an direction identical to the traveling direction of dielectric film 71. While dielectric film 71 is traveled in this state, metal vapor 144 that has evaporated from evaporation source 135 and passed through mask openings 140b, 141 of mask 134 comes into contact with the surface of dielectric film 71, so that vapor-deposited metal electrode 76 is formed by depositing and adhering metal vapor 144 on the surface of dielectric film 71. Metallized film 70, which has vapor-deposited metal electrode 76 formed on the surface of dielectric film 71, is wound onto winder 133.

A method for forming low resistance part 73, connecting part 75, high resistance part 72, and insulation margin 74 on the surface of dielectric film 71 will now be described.

FIG. 9 is a top view of mask 134 disposed between evaporation source 135 and dielectric film 71. The lateral direction in FIG. 9 corresponds to the traveling direction of dielectric film 71 (a longitudinal direction of dielectric film 71) traveling while being supported by cooling roller 132.

With reference to FIG. 9, mask 134 has mask openings 140b, 141 to allow metal vapor 144 that has evaporated from evaporation source 135 to pass through toward the surface of dielectric film 71, and mask blocks 140a to prevent metal vapor 144 from passing through.

Metal vapor 144 that has pass through mask openings 140b, 141 adheres to and gets deposited on the surface of dielectric film 71 such that vapor-deposited metal electrode 76 is formed. A length of mask openings 141 in the traveling direction of dielectric film 71 is longer than a length of mask openings 140b in the same direction. Connecting part 75 and low resistance part 73 are formed on regions facing long mask openings 141 in the surface of dielectric film 71. High resistance part 72 is formed on each of regions facing short mask openings 140b in the surface of dielectric film 71. The film thicknesses of connecting part 75 and low resistance part 73 are each thicker than the film thickness of high resistance part 72.

Since mask blocks 140a each prevent metal vapor 144 evaporated from evaporation source 135 from passing through toward the surface of dielectric film 71, insulation margin 74 having no vapor-deposited metal is formed on each of regions facing mask blocks 140a.

SUMMARY

The present disclosure provides a method for manufacturing a metallized film, the metallized film including: a dielectric film; a vapor-deposited metal electrode constituted by a vapor-deposited metal; and an insulation margin having none of the vapor-deposited metal. The vapor-deposited metal electrode and the insulation margin are formed on a surface of the dielectric film. The vapor-deposited metal electrode includes a plurality of parts which have mutually different resistance values. The method includes a step of letting oil adhere to a region in the surface of the dielectric film on which the parts of the vapor-deposited metal electrode are to be formed and then bringing a vapor of metal into contact with the surface of the dielectric film adhered by the oil in an atmosphere of a reduced pressure. A quantity per unit area of the oil adhering to a part of the region on which a part of the vapor-deposited metal electrode having a relatively low resistance value among the plurality of parts of the vapor-deposited metal electrode is to be formed is smaller than a quantity per unit area of the oil adhering to another part of the region on which another part of the vapor-deposited metal electrode having a relatively high resistance value among the plurality of parts of the vapor-deposited metal electrode is to be formed.

This configuration in the method of manufacturing provides a metallized film that contributes to the obtainment of a highly reliable metallized film capacitor.

DETAILED DESCRIPTION OF EMBODIMENT

Figure 1A:
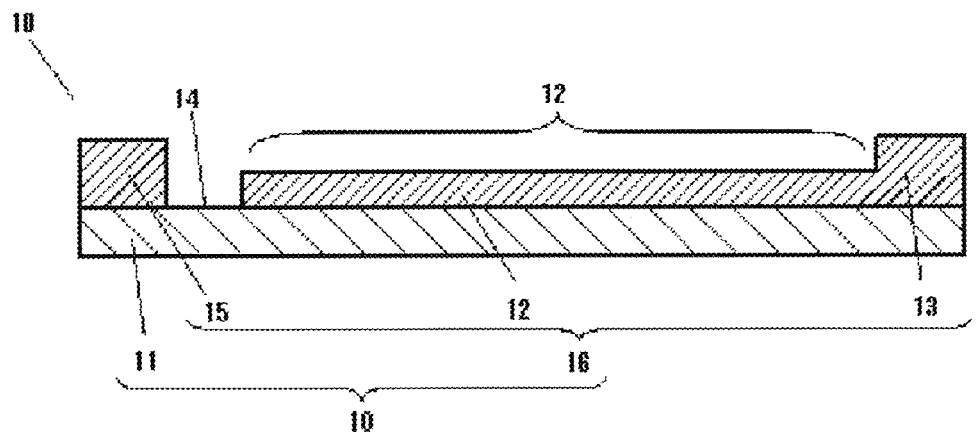
FIG. 1A is a cross-sectional view illustrating a structure of a metallized film made by a method of manufacturing according to an exemplary embodiment of the present disclosure.

Metallized film 70 can be made by the conventional method of manufacturing as described above. However, in metallized film 70 obtained by such a method of manufacturing, there are problems that need to be solved in terms of quality.

While metal vapor 144 coming from evaporation source 135 through mask 134 is continuously adhering to long-length dielectric film 71 according to the method of manufacturing as described above, a large amount of metal gets deposited on surfaces of mask 134 near evaporation source 135 and edges of mask openings 140b, 141. This creates problems as described below.

If the large amount of metal is deposited on the surfaces of mask 134 near evaporation source 135, the deposited metal naturally comes off the surface. The metal adhering to the surface is likely to come off and fall into molten metal 143 of evaporation source 135. As a result, molten metal 143 can disperse and adhere to the surface of dielectric film 71. Further, a reduction in the temperature of molten metal 143 temporarily occurs and causes to decrease a quantity of evaporating metal vapor 144. This may change the film thickness of formed vapor-deposited metal electrode 76 including low resistance part 73 and high resistance part 72.

When the large amount of metal is deposited on the edges of mask openings 140b, 141, the mask openings become narrow. Thus, dimensions of low resistance part 73, high resistance part 72, and insulation margin 74 may change. Further, a reduction in the quantity of passing metal vapor may occur and cause to change the film thickness of vapor-deposited metal electrode 76 including low resistance part 73 and high resistance part 72.

A change in the film thickness of vapor-deposited metal electrode 76 or changed dimensions of insulation margin 74 and other components negatively affect characteristics of the metallized film capacitor.

Metallized films each including vapor-deposited metal electrodes each having a plurality of parts with different resistance values can be manufactured by other methods as well as the method described above. For example, a method presented for forming a vapor-deposited metal electrode involves disposing a plurality of evaporation sources, i.e. an evaporation source used to evaporate a metal for formation of a high resistance part and an evaporation source used to evaporate a metal for formation of a low resistance part, and controlling quantities of the metals evaporated from the respective evaporation sources. Unfortunately, it is tough to exercise well-balanced control of the quantities of the metal vapors evaporated from the evaporation sources, and as a result, providing metallized films of stable quality is difficult in some cases.

In view of the problems described above, the present disclosure has been accomplished to provide a method for manufacturing a high-quality metallized film that ensures stability both in dimensions of an insulation margin and a film thickness of a vapor-deposited metal electrode.

An exemplary embodiment of the present disclosure will now be described with reference to the attached drawings. The scope of the present disclosure, however, should not be limited to the exemplary embodiment.

Exemplary Embodiment

Figure 1B:
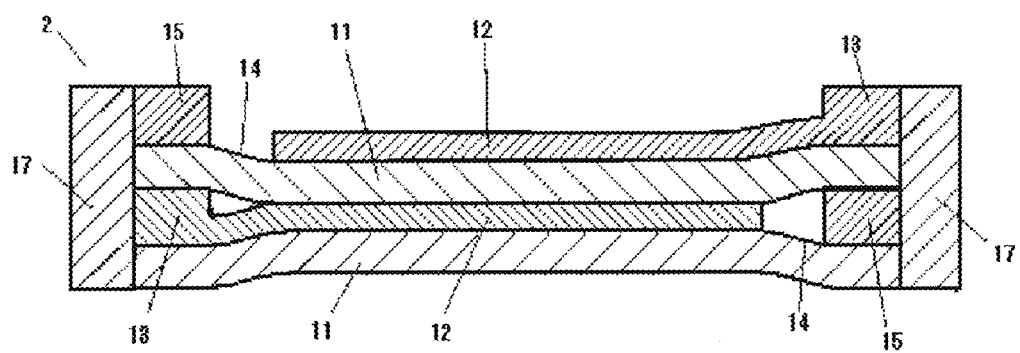
FIG. 1B is a cross-sectional view illustrating a structure of a capacitor element including the metallized film.
Figure 2:
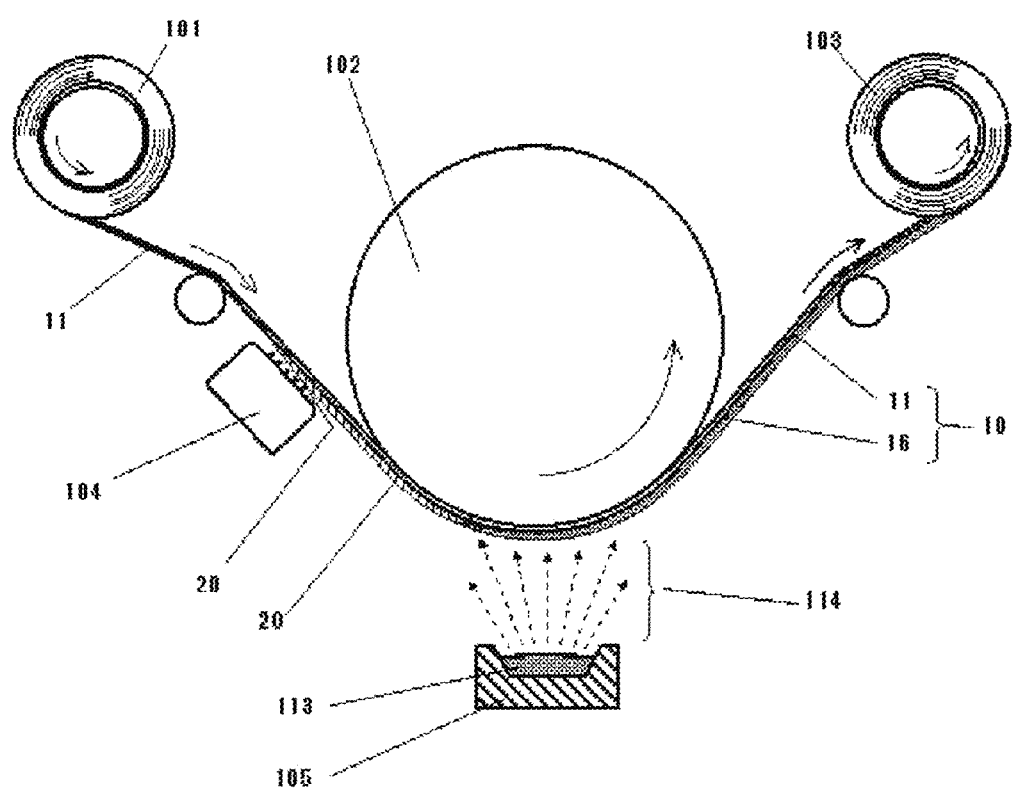
FIG. 2 is a schematic view illustrating a configuration of a vacuum deposition apparatus used to manufacture the metallized film according to the exemplary embodiment of the present disclosure.
Figure 3:
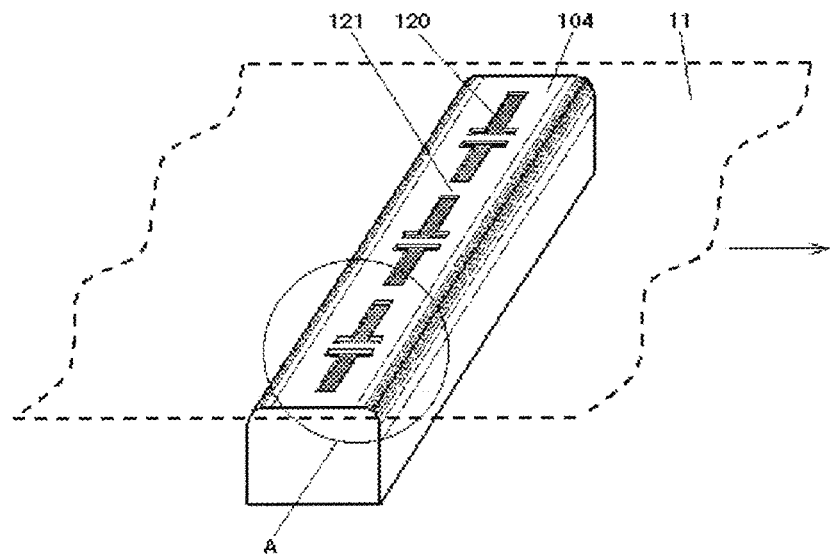
FIG. 3 is a schematic perspective view illustrating an oil nozzle according to the exemplary embodiment of the present disclosure.
Figure 4:
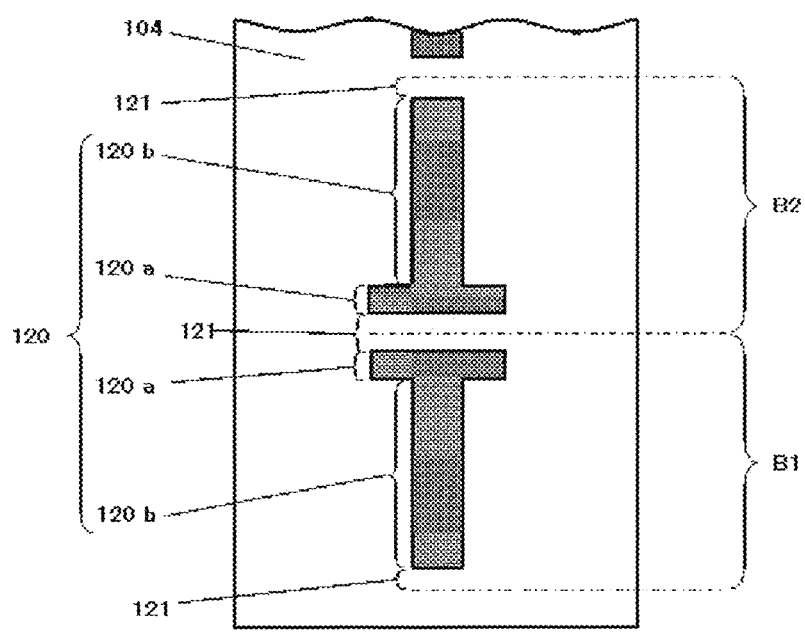
FIG. 4 is a top view illustrating an upper surface of the oil nozzle (a part indicated with the letter A in FIG. 3) according to the exemplary embodiment of the present disclosure.

FIG. 1A is a cross-sectional view illustrating a structure of a metallized film made by a method of manufacturing according to this exemplary embodiment. FIG. 1B is a cross-sectional view illustrating a structure of a capacitor element including the metallized film. FIG. 2 is a schematic view illustrating a configuration of a vacuum deposition apparatus used to manufacture the metallized film according to this exemplary embodiment. FIG. 3 is a schematic perspective view illustrating oil nozzle 104 in the vacuum deposition apparatus according to this exemplary embodiment. FIG. 4 is a top view illustrating an upper surface of oil nozzle 104 (a part indicated with the letter A in FIG. 3).

In this exemplary embodiment, a method for manufacturing metallized film 10 as shown in FIG. 1A is described. Metallized film 10 has high resistance part 12, low resistance part 13, and connecting part 15 included in vapor-deposited metal electrode 16, as well as insulation margin 14, which are formed on one surface of dielectric film 11.

With reference to FIG. 2, the vacuum deposition apparatus includes unwinder 101, cooling roller 102, oil nozzle 104, and evaporation source 105. Unwinder 101 is set with a roll of wound dielectric film 11 having no vapor-deposited metal electrode formed on the surface. Cooling roller 102 is to support and cool dielectric film 11. Oil nozzle 104 is disposed between unwinder 101 and cooling roller 102. Evaporation source 105 is disposed inside a vacuum chamber near cooling roller 102, the vacuum chamber being maintained in a state of near-vacuum reduced pressure. Unwinder 101 continuously unwinds dielectric film 11. Oil nozzle 104 lets oil 20 adhere to a surface of dielectric film 11. Evaporation source 105 melts a metal, i.e. a material for a vapor-deposited metal electrode, and evaporates the molten metal to supply a vapor of the metal to the surface of dielectric film 11 having adhering oil 20. The vacuum deposition apparatus further includes winder 103 to wind metallized film 10, which has vapor-deposited metal electrode 16 formed on the surface of dielectric film 11, into a roll form.

A resistance value of vapor-deposited metal electrode 16 formed on the surface of dielectric film 11 is controlled by a quantity of oil 20 adhering to the surface of the film. Here, a quantity of oil 20 may be, for example, a volume of oil 20.

With reference to drawings, a method for controlling the resistance value of vapor-deposited metal electrode 16 formed on the surface of dielectric film 11 will be described.

FIGS. 5A to 5D are cross-sectional views illustrating steps involved in manufacturing metallized film 10 according to this exemplary embodiment. The manufacturing steps are followed in the order from FIG. 5A to FIG. 5D.

Figure 5A:
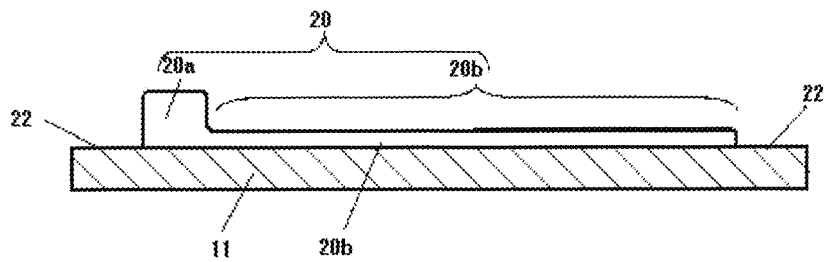
FIG. 5A is a cross-sectional view illustrating a step involved in manufacturing the metallized film according to the exemplary embodiment of the present disclosure.

FIG. 5A shows oil 20 adhering to the surface of dielectric film 11. In oil 20 adhering to the surface of dielectric film 11, oil 20b adheres to a region on which high resistance part 12 of vapor-deposited metal electrode 16 is to be formed and oil 20a adheres to a region on which insulation margin 14 is to be formed. A quantity per unit area of oil 20b is smaller than a quantity per unit area of oil 20a in the surface of dielectric film 11. In other words, if a quantity per unit area of oil 20 adhering to the surface of dielectric film 11 is schematically shown by a film thickness of oil 20 as illustrated in FIG. 5A, a film thickness of oil 20b adhering to the region on which high resistance part 12 of vapor-deposited metal electrode 16 is to be formed is thinner than a film thickness of oil 20a adhering to the region on which insulation margin 14 is to be formed. No oil 20 adheres to surface regions 22 of dielectric film 11 on which low resistance part 13 and connecting part 15 are to be formed. A method for controlling the quantity of oil 20 adhering to the surface of dielectric film 11 will be described later.

Figure 5B:
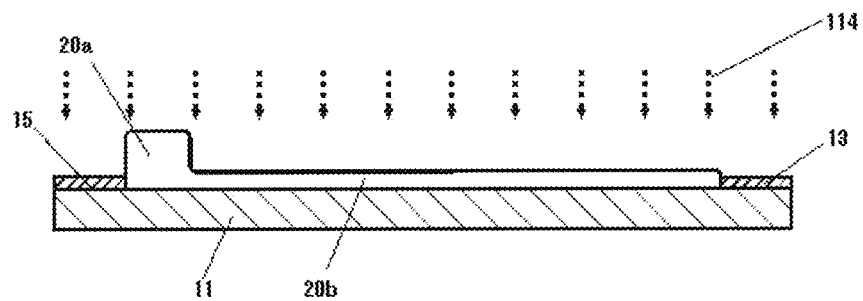
FIG. 5B is a cross-sectional view illustrating a step involved in manufacturing the metallized film according to the exemplary embodiment of the present disclosure.

FIG. 5B shows a state in which metal vapor 114 from evaporation source 105 is in contact with the surface of dielectric film 11 having adhering oil 20a, 20b. In the surface of dielectric film 11, no vapor-deposited metal electrode is formed both on a surface of oil 20a, which adheres to the region for formation of insulation margin 14, and a surface of oil 20b, which adheres to the region for formation of high resistance part 12. Oil 20 has partly evaporated and the amount of adhering oil 20 is decreasing due to radiant heat from molten metal 113 of the evaporation source and latent heat possessed by the metal vapor. Meanwhile, the metal gets deposited on surface regions 22 for formation of low resistance part 13 and connecting part 15 without adhering oil 20. Low resistance part 13 and connecting part 15 have started to form on these regions of dielectric film 11.

Figure 5C:
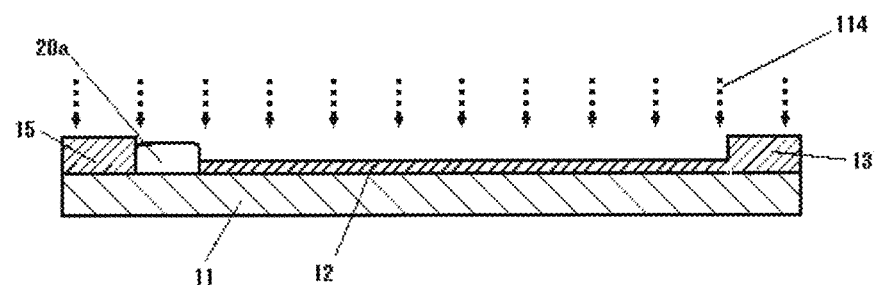
FIG. 5C is a cross-sectional view illustrating a step involved in manufacturing the metallized film according to the exemplary embodiment of the present disclosure.

FIG. 5C shows a state in which vapor deposition has advanced from the state shown in FIG. 5B. In the surface of dielectric film 11, no vapor-deposited metal electrode 16 is formed on the region for formation of insulation margin 14 because oil 20a still adheres to the region in spite of a decrease in the amount of the adhering oil. Oil 20b, which adheres to the region for formation of high resistance part 12, has almost gone from the surface of dielectric film 11. The metal gets deposited on the region such that high resistance part 12 has started to form. Film thicknesses of low resistance part 13 and connecting part 15 have increased by further vapor deposition of the metal.

Figure 5D:
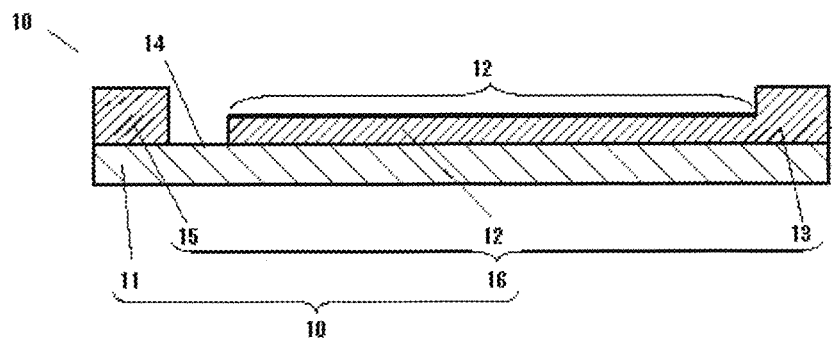
FIG. 5D is a cross-sectional view illustrating a step involved in manufacturing the metallized film according to the exemplary embodiment of the present disclosure.

FIG. 5D shows a state in which the formation of vapor-deposited metal electrode 16 and insulation margin 14 is completed. High resistance part 12, low resistance part 13, and connecting part 15 having respective desired film thicknesses are formed on the surface of dielectric film 11. The film thicknesses of low resistance part 13 and connecting part 15 are substantially equal to each other. The film thickness of high resistance part 12 is smaller than each of the film thicknesses of low resistance part 13 and connecting part 15. In vapor-deposited metal electrode 16, a part with a thinner film thickness has a higher resistance value than a part with a thicker film thickness. Thus, a resistance value of high resistance part 12 is higher than each of resistance values of low resistance part 13 and connecting part 15. In the surface of dielectric film 11, insulation margin 14 is formed on the region to which oil 20a adhered. Insulation margin 14 has little or no vapor-deposited metal such that insulation margin 14 does not act as an electrode.

With reference to drawings, a method for controlling the quantity of oil 20 adhering to the surface of dielectric film 11 will now be described in detail.

The quantity of oil 20 that adheres to the surface of dielectric film 11 can be controlled with oil nozzle 104.

Oil nozzle 104 has a function of vaporizing oil 20 by heating oil 20 contained inside up to a temperature between approximately 100° C. and 150° C. Oil nozzle 104 has at least one nozzle opening 120 on a surface thereof for discharging vaporized oil 20 to the outside of oil nozzle 104 and at least one nozzle block 121 on the same surface for blocking discharge of the vaporized oil to the outside.

With reference to FIG. 3, oil nozzle 104 is disposed in close proximity to dielectric film 11 such that the surface including nozzle opening 120 and nozzle block 121 faces one surface of traveling dielectric film 11 (an undersurface of the film in FIG. 3).

A vapor of oil 20 emitted from nozzle opening 120 comes into contact with a region in the surface of dielectric film 11, the region facing nozzle opening 120 of oil nozzle 104. And subsequently the vapor of oil 20 gets cooled and condensed such that oil 20 adheres to the region in the surface of dielectric film 11. Meanwhile, since no oil 20 is emitted from nozzle block 121 of oil nozzle 104, no oil 20 adheres to a region in the surface of dielectric film 11, the region facing nozzle block 121.

The quantity of oil 20 adhering to the surface of dielectric film 11 is controlled by increasing or decreasing a length of nozzle opening 120 of oil nozzle 104 in a traveling direction (a longitudinal direction) of dielectric film 11 whose surface faces nozzle opening 120.

Specifically, with reference to FIG. 4, nozzle opening 120 provided in oil nozzle 104 includes nozzle opening segments 120a (hereinafter referred to as long nozzle opening segments) that are each long in the traveling direction (the lateral direction in FIG. 4) of dielectric film 11 whose surface faces nozzle opening 120 and nozzle opening segments 120b (hereinafter referred to as short nozzle opening segments) that are each short in the traveling direction of dielectric film 11. Considering a first point on the surface of dielectric film 11 faces long nozzle opening segment 120a and a second point on the surface of dielectric film 11 faces short nozzle opening segment 120b, a period of time for which the first point is in contact with a vapor of oil 20 emitted from long nozzle opening segment 120a is longer than a period of time for which the second point is in contact with a vapor of oil 20 emitted from short nozzle opening segment 120b. Consequently, in the surface of dielectric film 11, a quantity per unit area of oil 20 adhering to a region facing long nozzle opening segment 120a can be greater than a quantity per unit area of oil 20 adhering to a region facing short nozzle opening segment 120b.

Sections denoted by reference signs B1 and B2 in FIG. 4 are each corresponding to a width of one metallized film 10 used in a single metallized film capacitor. With reference to FIG. 4, actual metallized film 10 is manufactured using broad dielectric film 11. Vapor-deposited metal electrodes 16 and insulation margins 14 are formed on broad dielectric film 11 across a width of the film such that a plurality of metallized films 10 are obtained. Then, broad dielectric film 11 is slit so as to split the film in the width direction and metallized films 10 that are each to be used for a metallized film capacitor are obtained.

Examples of oil 20 include fluorinated oil and paraffin oil. Since fluorinated oil is highly heat resistant compared to paraffin and other oil, fluorinated oil is hard to be decomposed by heat during vapor deposition and results in less decomposed residues on dielectric film 11. Thus, in the present disclosure, fluorinated oil is advantageous especially in terms of ensuring the quality of metallized film 10.

The quantity of oil 20 that adheres to the surface of dielectric film 11 can be suitably determined depending on the type of oil 20 used, a metal used in vapor-deposited metal electrode 16, a film thickness of vapor-deposited metal electrode 16, a configuration of a vapor-deposition device, conditions for vapor deposition, and other requirements.

As described above, the quantity of oil 20 adhering to the surface of dielectric film 11 can be controlled. As a result, metallized films 10 that each include vapor-deposited metal electrode 16 formed of a plurality of parts with different resistance values can be obtained at one vapor deposition opportunity without an increase in a number of evaporation sources, with proviso that no oil 20 adheres to a region for formation of a relatively low resistant part of vapor-deposited metal electrode 16 or that a quantity per unit area of oil 20 adhering to a region for formation of a relatively low resistant part of vapor-deposited metal electrode 16 is smaller than a quantity per unit area of oil 20 adhering to a region for formation of a relatively high resistant part of vapor-deposited metal electrode 16 in the surface of dielectric film 11.

As described above, the present disclosure eliminates the need for disposing a mask between evaporation source 105 and dielectric film 11 supported by cooling roller 102 to control the quantity of metal vapor 114 reaching the surface of dielectric film 11 from evaporation source 105. Thus, this configuration cancels out negative effects due to the deposition of metal on mask openings as in conventional techniques and enables the attainment of high-quality metallized film 10 that ensures high accuracy both in the film thickness of vapor-deposited metal electrode 16 formed on the surface of dielectric film 11 and in dimensions of the insulation margin and other components. Thus, with reference to FIG. 1B, if capacitor element 2 is produced by forming metallikon electrodes 17 on either a wound body or a laminate of metallized films 10 made by the method of manufacturing according to the present disclosure, a metallized film capacitor with high reliability can be obtained.

Conventionally, an oil margin method was used to form an insulation margin having no vapor-deposited metal in manufacturing a metallized film. The oil margin method includes letting oil adhere in advance to a region for formation of an insulation margin on a surface of a dielectric film and getting an evaporated metal to deposit on the surface so as to form the insulation margin having no vapor-deposited metal and an vapor-deposited metal electrode. However, it has been considered that the formation of the insulation margin using oil like this method worsens the film quality of the vapor-deposited metal electrode and reduces adhesion of the vapor-deposited metal electrode to the dielectric film due to behavior of the oil during vapor deposition and the remaining oil on the metallized film after vapor deposition. Thus, it has been believed that letting oil adhere in advance to a region for formation of a vapor-deposited metal electrode on a dielectric film causes a reduction in the quality of a metallized film.

Implementation of the present disclosure, however, showed no reduction in the quality of a metallized film, such as a worsening of film quality and a reduction in the adhesion of a vapor-deposited metal electrode to a dielectric film, even in a part of a vapor-deposited metal electrode (a high resistance part of the exemplary embodiment) formed on a region to which oil adhered, on a surface of the dielectric film.

This is presumably owing to proper control of the quantity of the oil adhering to the dielectric film with satisfactory accuracy and formation of the vapor-deposited metal electrode after removal of the adhering oil from the dielectric film following evaporation of the oil by radiant heat from an evaporation source and latent heat possessed by a metal vapor.

Formation of belt-shaped regions such as insulation margins 14, which extend continuously in the longitudinal direction of dielectric film 11 and have no vapor-deposited metal, may be performed by a tape margin method, while formation of vapor-deposited metal electrodes 16 each having a plurality of parts with different resistance values may be performed by the method of letting oil adhere to the surface of dielectric film 11 as described above. In this case as well, metallized films 10 that each include vapor-deposited metal electrode 16 having a plurality of parts with different resistance values can be obtained at one vapor deposition opportunity.

Figure 6A:
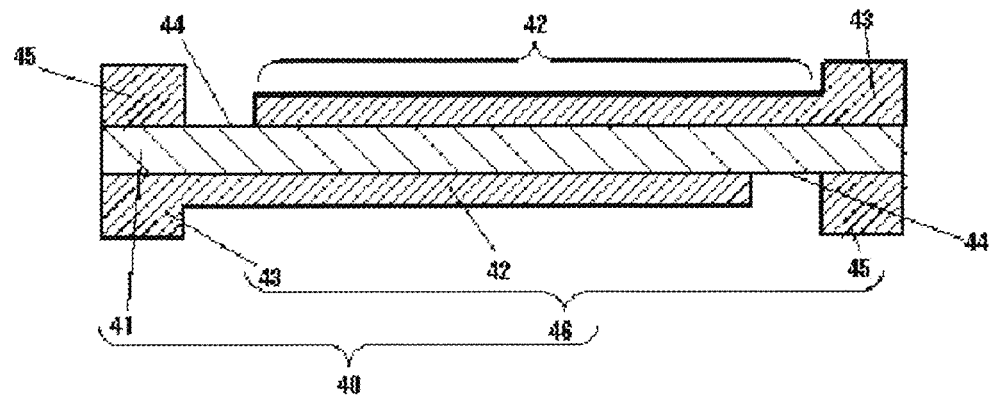
FIG. 6A is a cross-sectional view illustrating a structure of another metallized film made by a method of manufacturing according to an exemplary embodiment of the present disclosure.
Figure 6B:
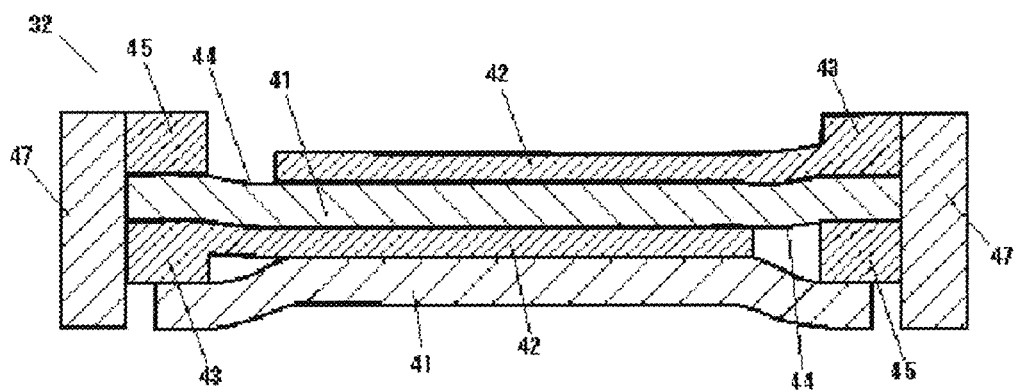
FIG. 6B is a cross-sectional view illustrating a structure of a capacitor element including the metallized film.
Figure 7:
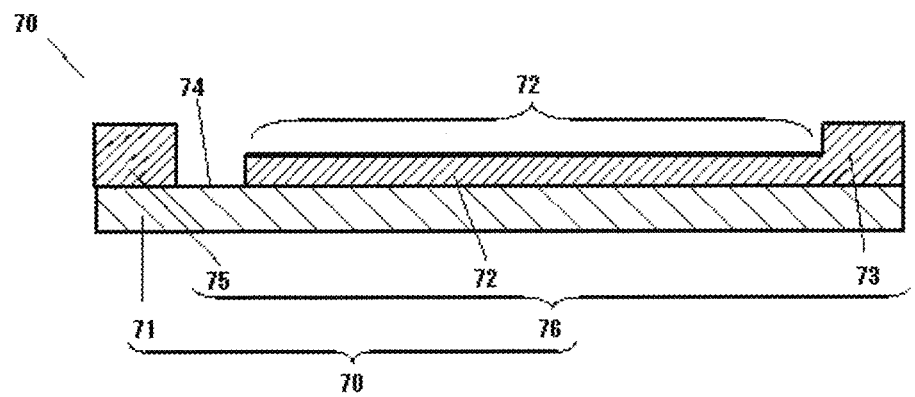
FIG. 7 is a cross-sectional view of a structure of a metallized film illustrated to describe a conventional technique.
Figure 8:
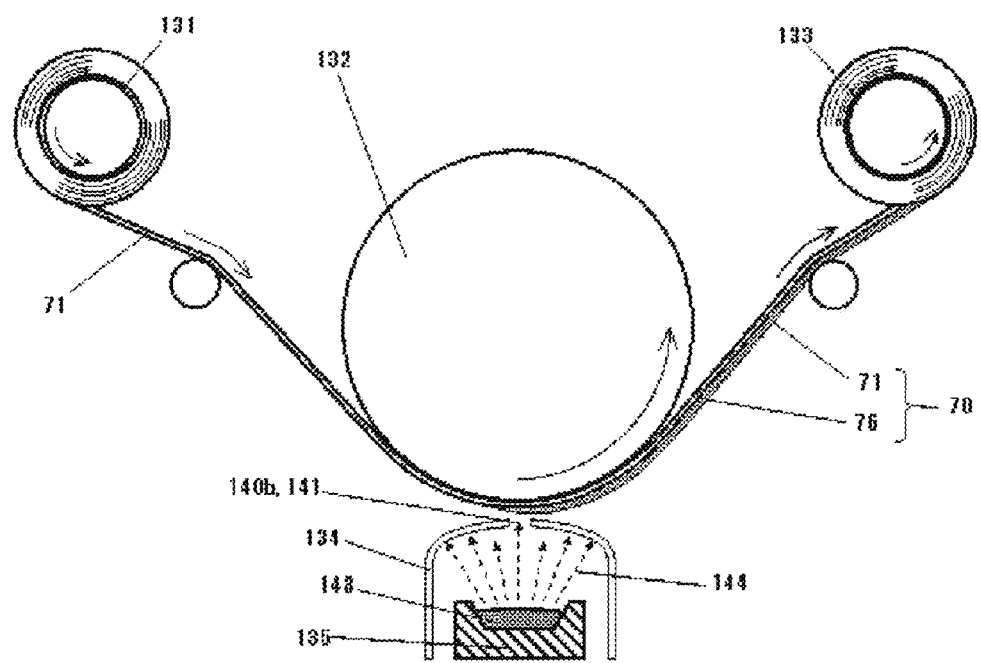
FIG. 8 is a schematic view illustrating a configuration of a conventional vacuum deposition apparatus used to manufacture a metallized film.
Figure 9:
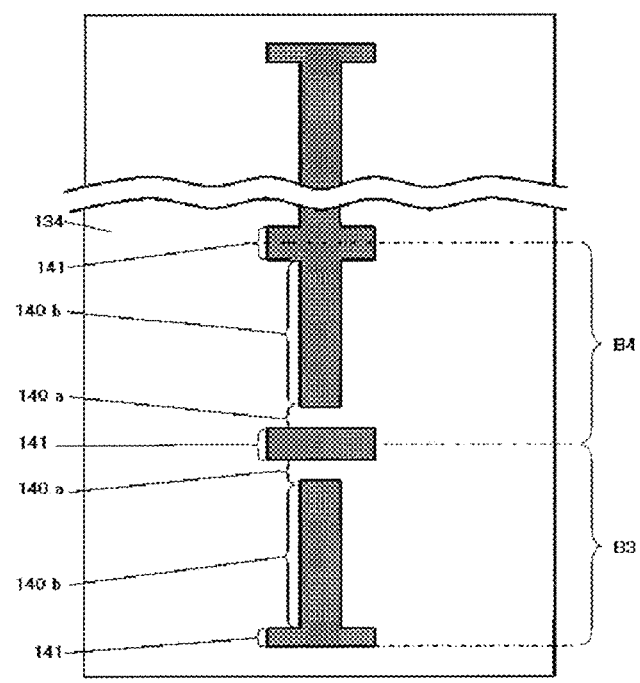
FIG. 9 is a top view illustrating a mask disposed in the conventional vacuum deposition apparatus.

In the exemplary embodiment described above, the method for manufacturing metallized film 10 that includes vapor-deposited metal electrode 16 formed only on one side of dielectric film 11 is described. As shown in FIG. 6A, metallized film 40 may be made using a method for manufacturing a metallized film according to the present disclosure, wherein metallized film 40 has high resistance parts 42, low resistance parts 43, and connecting parts 45 included in vapor-deposited metal electrodes 46, as well as insulation margins 44, which are formed on both sides of dielectric film 41. With reference to FIG. 6B, if capacitor element 32 is produced by forming metallikon electrodes 47 on metallized film 40, a metallized film capacitor with high reliability can be obtained.

The present disclosure is useful for metallized film capacitors used for various electric components of electronic devices, electric devices, industrial devices, vehicles or the like.

What is claimed is:

1. A method for manufacturing a metallized film, the metallized film including: a dielectric film; a vapor-deposited metal electrode constituted by a vapor-deposited metal; and an insulation margin having none of the vapor-deposited metal, the vapor-deposited metal electrode and the insulation margin being formed on a surface of the dielectric film, the vapor-deposited metal electrode including a plurality of parts which have mutually different resistance values, the method comprising:
a step of letting oil adhere to a region in the surface of the dielectric film on which the plurality of parts of the vapor-deposited metal electrode are to be formed; and
a step of bringing, after the step of letting oil adhere, a vapor of metal into contact with the surface of the dielectric film adhered by the oil in an atmosphere of a reduced pressure, wherein:
the oil adheres to both a first part of the region on which a first part of the vapor-deposited metal electrode having a relatively low resistance value among the plurality of parts of the vapor-deposited metal electrode is to be formed and a second part of the region on which a second part of the vapor-deposited metal electrode having a relatively high resistance value among the plurality of parts of the vapor-deposited metal electrode is to be formed,
a quantity per unit area of the oil adhering to the first part of the region is smaller than a quantity per unit area of the oil adhering to the second part of the region,
the oil adhering to the second part of the region is formed to be in substantially uniform thickness in an entirety of the second part of the region, and
the second part of the region is larger in area than the first part of the region.

2. The method for manufacturing the metallized film according to claim 1, wherein:
the oil adheres to another region in the surface of the dielectric film on which the insulation margin is to be formed, in addition to the region on which the parts of the vapor-deposited metal electrode are to be formed, and
a quantity per unit area of the oil adhering to the another region on which the insulation margin is to be formed is larger than the quantity per unit area of the oil adhering to the second part of the region.

3. The method for manufacturing the metallized film according to claim 2, wherein the oil is fluorinated oil.

4. The method for manufacturing the metallized film according to claim 2, wherein:
in the step of letting oil adhere, an oil nozzle is disposed so that a surface having a nozzle opening of the oil nozzle faces the surface of the dielectric film, the oil nozzle emitting a vapor of the oil from the nozzle opening to let the oil adhere to the surface of the dielectric film while the dielectric film is travelling in a first direction,
the nozzle opening includes a plurality of nozzle opening segments whose lengths in the first direction are different from each other, and
a quantity per unit area of the oil adhering to the surface of the dielectric film is controlled by each of the lengths of the plurality of nozzle opening segments.

5. The method for manufacturing the metallized film according to claim wherein the oil is fluorinated oil.

6. The method for manufacturing the metallized film according to claim 1, wherein:
in the step of letting oil adhere, an oil nozzle is disposed so that a surface having a nozzle opening of the oil nozzle faces the surface of the dielectric film, the oil nozzle emitting a vapor of the oil from the nozzle opening to let the oil adhere to the surface of the dielectric film while the dielectric film is travelling in a first direction,
the nozzle opening includes a plurality of nozzle opening segments whose lengths in the first direction are different from each other, and
a quantity per unit area of the oil adhering to the surface of the dielectric film is controlled by each of the lengths of the plurality of nozzle opening segments.

7. A method for manufacturing a metallized film, the metallized film including: a dielectric film; a vapor-deposited metal electrode constituted by a vapor-deposited metal; and an insulation margin having none of the vapor-deposited metal, the vapor-deposited metal electrode and the insulation margin being formed on a surface of the dielectric film, the vapor-deposited metal electrode including a plurality of parts which have mutually different resistance values, the method comprising:

a step of letting oil adhere to a region in the surface of the dielectric film on which the plurality of parts of the vapor-deposited metal electrode are to be formed; and a step of bringing, after the step of letting oil adhere, a vapor of metal into contact with the surface of the dielectric film adhered by the oil in an atmosphere of a reduced pressure, wherein:

none of the oil adheres to a first part of the region on which a first part of the vapor-deposited metal electrode having a relatively low resistance value among the plurality of parts of the vapor-deposited metal electrode is to be formed, the oil adheres to a second part of the region on which a second part of the vapor-deposited metal electrode having a relatively high resistance value among the plurality of parts of the vapor-deposited metal electrode is to be formed, the oil adhering to the second part of the region is formed to be in uniform thickness in an entirety of the second part of the region, and the second part of the region is larger in area than the first part of the region.

8. The method for manufacturing the metallized film according to claim 7, wherein:

the oil adheres to another region in the surface of the dielectric film on which the insulation margin is to be formed, in addition to the region on which the parts of the vapor-deposited metal electrode are to be formed, and a quantity per unit area of the oil adhering to the another region on which the insulation margin is to be formed is larger than the quantity per unit area of the oil adhering to the second part of the region.

9. The method for manufacturing the metallized film according to claim 8, wherein the oil is fluorinated oil.

10. The method for manufacturing the metallized film according to claim 8, wherein:

in the step of letting oil adhere, an oil nozzle is disposed so that a surface having a nozzle opening of the oil nozzle faces the surface of the dielectric film, the oil nozzle emitting a vapor of the oil from the nozzle opening to let the oil adhere to the surface of the dielectric film while the dielectric film is travelling in a first direction, the nozzle opening includes a plurality of nozzle opening segments whose lengths in the first direction are different from each other, and a quantity per unit area of the oil adhering to the surface of the dielectric film is controlled by each of the lengths of the plurality of nozzle opening segments.

11. The method for manufacturing the metallized film according to claim 7, wherein the oil is fluorinated oil.

12. The method for manufacturing the metallized film according to claim 7, wherein:

in the step of letting oil adhere, an oil nozzle is disposed so that a surface having a nozzle opening of the oil nozzle faces the surface of the dielectric film, the oil nozzle emitting a vapor of the oil from the nozzle opening to let the oil adhere to the surface of the dielectric film while the dielectric film is travelling in a first direction, the nozzle opening includes a plurality of nozzle opening segments whose lengths in the first direction are different from each other, and a quantity per unit area of the oil adhering to the surface of the dielectric film is controlled by each of the lengths of the plurality of nozzle opening segments.

* * * * *